(12) United States Patent
Takeda (10) Patent No.: US 10,216,874 B2
(45) Date of Patent: Feb. 26, 2019

(54) ROBOT SIMULATION DEVICE

(71) Applicant: FANUC Corporation, Yamanashi (JP)

(72) Inventor: Toshiya Takeda, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/927,503

(22) Filed: Oct. 30, 2015

(65) Prior Publication Data

US 2016/0132623 A1    May 12, 2016

(30) Foreign Application Priority Data

Nov. 6, 2014   (JP) .................................. 2014-226164

(51) Int. Cl.
G06F 17/50   (2006.01)
B25J 9/16    (2006.01)

(52) U.S. Cl.
CPC ........ *G06F 17/5022* (2013.01); *B25J 9/1605* (2013.01); *G06F 17/5009* (2013.01); *Y10S 901/01* (2013.01); *Y10T 74/20305* (2015.01)

(58) Field of Classification Search
None
See application file for complete search history.

(56) References Cited

U.S. PATENT DOCUMENTS

| | | | | |
|---|---|---|---|---|
| 8,594,843 B2* | 11/2013 | Takeda | ............... | G05B 19/4069 700/245 |
| 2005/0055131 A1* | 3/2005 | Mikami | ............... | B62D 57/032 700/245 |
| 2005/0240307 A1* | 10/2005 | Kuroki | ................... | B25J 13/085 700/245 |
| 2006/0285758 A1* | 12/2006 | Marugame | .............. | G06T 9/001 382/236 |
| 2009/0171503 A1* | 7/2009 | Takenaka | ............. | B62D 57/032 700/250 |
| 2010/0250001 A1* | 9/2010 | Hodgins | .............. | B62D 57/032 700/261 |
| 2011/0154934 A1* | 6/2011 | Skourup | .............. | B25J 19/0075 74/490.03 |
| 2012/0004751 A1* | 1/2012 | Nagatsuka | .......... | G06F 17/5009 700/98 |

(Continued)

FOREIGN PATENT DOCUMENTS

| | | |
|---|---|---|
| CN | 101124106 A | 2/2008 |
| CN | 102909725 A | 2/2013 |

(Continued)

*Primary Examiner* — Kibrom K Gebresilassie
(74) *Attorney, Agent, or Firm* — Hauptman Ham, LLP (57) ABSTRACT

A robot simulation device includes, a model generation unit which generates a three-dimensional wire-shaped member model from a plurality of mass points and a plurality of spring elements, a focus point setting unit which sets a plurality of focus points on the wire-shaped member model, a simulation unit which performs a simulation of the behavior of the wire-shaped member associated with the operation of the robot using the wire-shaped member model, and a display unit which displays focus point images, together with wire-shaped member images, using position data of the plurality of mass points and position data of the plurality of focus points which are obtained via the simulation.

2 Claims, 4 Drawing Sheets

(56) References Cited

U.S. PATENT DOCUMENTS

| | | | |
|---|---|---|---|
| 2012/0059629 A1* | 3/2012 | Hashima | G06F 17/5009 703/1 |
| 2012/0078416 A1* | 3/2012 | Iba | B62D 57/032 700/246 |
| 2013/0035789 A1* | 2/2013 | Takeda | G05B 19/4069 700/245 |
| 2013/0144441 A1* | 6/2013 | Kanazawa | B25J 9/1607 700/263 |
| 2014/0010704 A1* | 1/2014 | Ishida | C22F 1/08 420/471 |
| 2015/0231786 A1* | 8/2015 | Doi | B62D 57/032 700/245 |
| 2016/0016308 A1* | 1/2016 | Kanazawa | B25J 9/1607 700/263 |
| 2017/0036346 A1* | 2/2017 | Kamioka | B25J 9/1664 |

FOREIGN PATENT DOCUMENTS

| | | |
|---|---|---|
| CN | 202846534 U | 4/2013 |
| JP | 7-182017 A | 7/1995 |
| JP | 10-275007 A | 10/1998 |
| JP | 2001-251740 A | 9/2001 |
| JP | 2004-74368 A | 3/2004 |
| JP | 2005-50602 A | 2/2005 |
| JP | 2005-293331 A | 10/2005 |
| JP | 2013-35083 A | 2/2013 |

* cited by examiner

ROBOT SIMULATION DEVICE

RELATED APPLICATION

The present application claims priority of Japanese Application No. 2014-226164, filed Nov. 6, 2014, the disclosure of which is hereby incorporated by reference herein in its entirety.

BACKGROUND OF THE INVENTION

1. Field of the Invention

The present invention relates to a robot simulation device which simulates the operation of a robot on which a wire-shaped member is arranged.

2. Description of the Related Art

In a robot on which a wire-shaped member is arranged, it sometimes happens that the wire-shaped member is subjected to torsion in association with the operation of the robot. In this regard, a device is conventionally known that is configured to calculate the torsion amount of a wire-shaped member based on the torsion due to rotation of the wire-shaped member at a first fixing point and a second fixing point where the wire-shaped member is fixed and the positional relationship between the first fixing point and the second fixing point (refer to Japanese Laid-open Patent Publication No. 2005-293331, for example). Further, such a device is known in the art that is configured to generate a simulation model of wire-shaped member from a plurality of mass points and springs connecting the mass points together and perform a simulation of the behavior of the wire-shaped member (refer to Japanese Laid-open Patent Publication No. 2013-35083, for example).

However, with the device disclosed in Japanese Laid-open Patent Publication No. 2005-293331 referred to above, it is difficult to grasp the torsioned state at each part in the longitudinal direction of the wire-shaped member (e.g., the torsioned state at an intermediate point between the first fixing point and the second fixing point) since the torsion amount of the wire-shaped member is calculated in view of the first fixing point and the second fixing point. Further, the torsioned state of the wire-shaped member cannot be easily grasped merely by performing a simulation of the behavior of the wire-shaped member as in the device disclosed in Japanese Laid-open Patent Publication No. 2013-35083 referred to above.

SUMMARY OF INVENTION

An aspect of the present invention is a robot simulation device which simulates a behavior of a wire-shaped member arranged on a robot, the robot simulation device including a model generation unit which generates a three-dimensional model of the wire-shaped member from a plurality of mass points set along the longitudinal direction of the wire-shaped member so as to define the outer circumferential surface of the wire-shaped member and a plurality of spring elements connecting the plurality of mass points together. The robot simulation device includes a focus point setting unit which sets, on the three-dimensional model of the wire-shaped member, a plurality of focus points for grasping the torsioned state of the wire-shaped member. The robot simulation device includes a simulation unit which simulates the behavior of the wire-shaped member associated with the operation of the robot using the three-dimensional model of the wire-shaped member. The robot simulation device includes a display unit which displays focus point images representing the focus points, together with wire-shaped member images representing the profile of the wire-shaped member, using time-series position data of the plurality of mass points and time-series position data of the plurality of focus points, which are obtained via the simulation performed by the simulation unit.

DETAILED DESCRIPTION

Referring now to FIGS. 1 to 5, description will be made of a robot simulation device according to an embodiment of the present invention. The robot simulation device is a device which simulates the operation of a robot offline, for example, and displays the result of the simulation. The robot simulation device according to the present embodiment may be applied to a vertical articulated robot, for example. The vertical articulated robot includes a plurality of arms which are rotationally driven by a servomotor, and a hand attached to an arm distal end.

In this type of robot, a wire-shaped member is wired along the plurality of arms. More specifically, a wire-shaped member arrangement unit is provided on the outer circumferential surface of the arm. The wire-shaped member is fixed to the arrangement unit partly in the longitudinal direction. The wire-shaped member is a general term of wiring, piping or the like including wiring such as a power line for a servomotor, a variety of signal lines or the like, plumbing for feeding a liquid or gas, etc. The wire-shaped member may use not only a material having a high elasticity such rubber or the like but also a material having a low elasticity such as optical fiber cable or the like, for example.

The wire-shaped member is moved in unison with the robot at an arrangement unit since the wire-shaped member is arranged on the robot via the arrangement unit. Therefore, the wire-shaped member may be deformed in association with the operation of the robot so as to be subjected to torsion. When the wire-shaped member is formed of an optical fiber cable and subjected to torsion, the wire-shaped member may be broken or damaged. In order to avoid this, it is preferred to grasp beforehand the torsioned state of the wire-shaped member associated with the operation of the robot. Thus, in the present embodiment, the robot simulation device is configured as described below.

Figure 1:
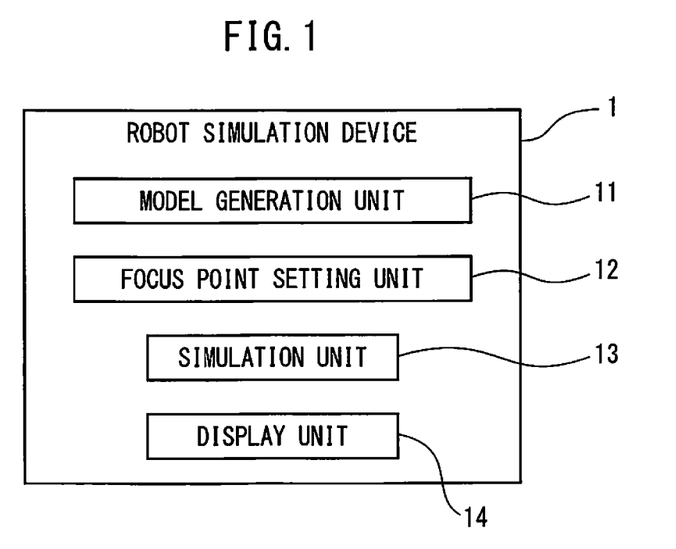
FIG. 1 is a block diagram illustrating the configuration of a robot simulation device according to an embodiment of the present invention.

FIG. 1 is a block diagram illustrating the configuration of a robot simulation device 1 according to an embodiment of the present invention. The robot simulation device 1 is configured to include an arithmetic processing unit including CPU (Central Processing Unit), ROM (Read Only Memory), RAM (Random Access Memory), and other peripheral circuitry. The robot simulation device 1 includes, as a functional structure, a model generation unit 11, a focus point setting unit 12, a simulation unit 13, and a display unit 14.

The model generation unit 11 generates a three-dimensional model of the robot (robot model), and a three-dimensional model of the wire-shaped member which is attached to the robot model at a wire-shaped member arrangement unit formed on the robot model. The robot model and the wire-shaped member model represent a three-dimensional shaped robot and a wire-shaped member, respectively, and may be generated using CAD data or the like of the robot and the wire-shaped member inputted via an unillustrated input unit, for example.

Figure 2:
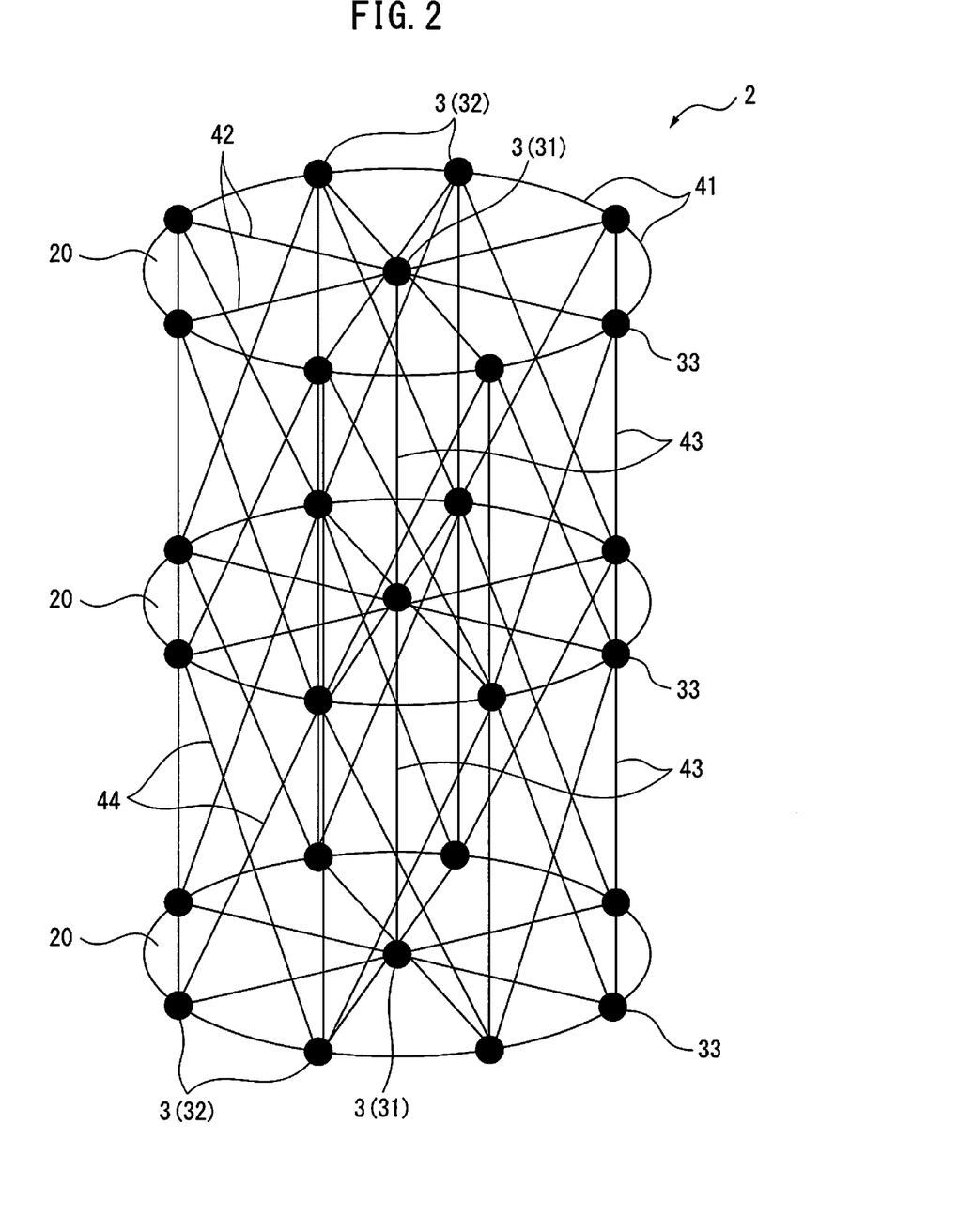
FIG. 2 is a perspective view illustrating an example of a wire-shaped member model used with the robot simulation device according to the embodiment of the present invention.

FIG. 2 is a perspective view illustrating an example of the wire-shaped member model 2 having a circular cross section. As illustrated in FIG. 2, the wire-shaped member model 2 is formed of a plurality of mass points 3, and a plurality of spring elements 4 connecting the mass points 3 together. The mass point 3 includes a first mass point 31 and second mass points 32, which are located on a plane 20 perpendicular to the longitudinal direction of the wire-shaped member. The first mass point 31 is located at the diametrical center of the plane 20. The second mass points 32 are located around the first mass point 31 at circumferentially uniform intervals so as to define an outer circumferential surface of the wire-shaped member. The first mass points 31 and the second mass points 32 are located at uniform intervals along the longitudinal direction the wire-shaped member. Each mass point 3 has mass information, three-dimensional position information (position data), and three-dimensional speed information. The mass of each mass point 3 may be of a value equal to the mass of the wire-shaped member divided by the number of the mass points.

The spring elements 4 include first springs 41 connecting together the second mass points 32 located on the circumferences of the respective planes 20. The spring elements 4 include second springs 42 extending radially from the first mass points 31 and connecting the first mass points 31 to the second mass points 32 on the planes 20. The spring elements 4 include third springs 43 arranged in line along the longitudinal direction of the wire-shaped member and connecting sequentially the first mass points 31 together and the second mass points 32 together. The spring elements 4 include fourth springs 44 connecting together diagonally the second mass points 32 arranged in the longitudinal direction. The first springs 41 and the second spring 42 represent the diametric elasticity of the wire-shaped member. The third springs 43 and the fourth springs 44 represent the longitudinal elasticity of the wire-shaped member.

The focus point setting unit 12 sets, on the wire-shaped member model 2, a plurality of focus points 33 to grasp the torsioned state of the wire-shaped member. In FIG. 2, the focus points 33 are set on parts in the circumferential direction of the wire-shaped member model. More specifically, the focus points 33 are set on the second mass points 32 connected sequentially together via the third springs 43 in line along the longitudinal direction of the wire-shaped member. The focus points 33 may be arbitrarily set by the user on the wire-shaped member model 2 via an input unit.

The simulation unit 13 causes the robot model to operate in accordance with a predetermined operation program and simulates the behavior of the wire-shaped member associated with the operation of the robot. In other words, in association with the operation of the robot, the simulation unit 13 calculates, for each predetermined unit time, the elastic force, gravity, and damping force from the spring elements 4 acting on the respective mass points 3 of the wire-shaped member model 2. The simulation unit 13 executes simulation (physical simulation) so that the position of each mass point 3 is changed for each unit time.

In this instance, when a mass point 3A and a mass point 3B are connected with each other via the spring element 4, an elastic force F1 of the spring element 4 acting on the mass point 3A can be calculated in accordance with the following equation (I):

$$F1 = (\text{unit vector directed from 3A to 3B}) \times (\text{spring constant}) \times (\text{spring expansion amount}) \quad (\text{I})$$

In the above equation (I), let it be assumed that the expansion amount of the spring element 4 (spring expansion amount) is a value equal to the length of the spring element 4 under a certain condition from which the natural length of the spring element 4 is subtracted. The natural length of the spring element 4 corresponds to the distance between the mass points 3A and 3B under a natural condition in which there are no expansion and bending of the wire-shaped member model 2.

The damping force of the spring element includes a damping force F2 suppressing the vibration of the spring and a damping force F3 suppressing the translational motion of each mass point 3, which can be calculated in accordance with the following equations (II) and (III), respectively:

$$F2 = v \times (\text{inner product of } v) \times (\text{damping coefficient of the vibration}) \quad (\text{II})$$

$$F3 = (\text{speed of each mass point}) \times (\text{damping coefficient of the translational motion}) \quad (\text{III})$$

In the above equation (II), v is a unit vector of (the speed of the mass point 3B minus the speed of the mass point 3A). The damping forces F2 and F3 act to slow the motion of the spring.

A gravity F4 acting on each mass point 3 can be calculated in accordance with the following equation (IV):

$$F4 = (\text{unit vector in the direction of the gravity}) \times (\text{gravity acceleration}) \times (\text{mass of the mass point}) \quad (\text{IV})$$

When the mass point 3 of the wire-shaped member model 2 collides with a certain interference plane, a repulsion force acts on the mass point. In view of this, the repulsion force acting on the mass point may be calculated in addition to the elastic force, gravity, and damping force. In this instance, the value of the component, in the vertical direction of the collided plane, of the speed of the mass point at the time of the collision becomes a value that the speed prior to the collision is multiplied by a repulsion factor and the sign is reversed. Then, the repulsion force can be calculated by multiplying the mass of the mass point to the acceleration obtained by dividing by unit time the amount of change in speed between before and after the collision.

The simulation unit 13 calculates the resultant force of the forces F1 to F4 acting on each mass point 3, and calculates the acceleration of the mass point 3 by dividing the resultant force by the mass of the mass point. Further, the simulation unit 13 calculates an amount of change in speed of the mass point 3 in accordance with (the acceleration)×(unit time), and calculate the speed of the mass point 3 by adding the amount of change to the speed of the mass point 3. Moreover, the simulation unit 13 calculates an amount of displacement of the mass point 3 in accordance with speed×unit time, and calculates the position of the mass point 3 by adding the amount of displacement to the three-dimensional position data of the mass point 3.

In other words, the simulation unit 13 changes, for each unit time, the position of the mass point 3 at the wire-shaped member arrangement unit in conformity to the motion of the robot. The simulation unit 13 calculates the forces F1 to F4 acting on each mass point 3 as described above, and calculates the resultant force of these forces. The simulation unit 13 simulates the behavior of the wire-shaped member by updating the speed and position of each mass point 13. In this manner, the time-series position data of each mass point 3 can be obtained. Further, since the focus points 33 are part of the mass points 3, the position data of the focus points 33 can also be obtained.

The display unit 14 includes a display monitor, and a display control unit for displaying an image on the display monitor. The display unit 14 displays the three-dimensional wire-shaped member image representing the profile of the wire-shaped member using the time-serial position data of each mass point 3 obtained via the simulation executed by the simulation unit 13. Further, the display unit 14 displays three-dimensional focus point images representing the focus points 33 using the time-serial position data of the plurality of focus points 33. In other words, the display unit 14 displays, on the display monitor, moving images of the wire-shaped member image and the focus point image which change for each predetermined time.

Figure 3:
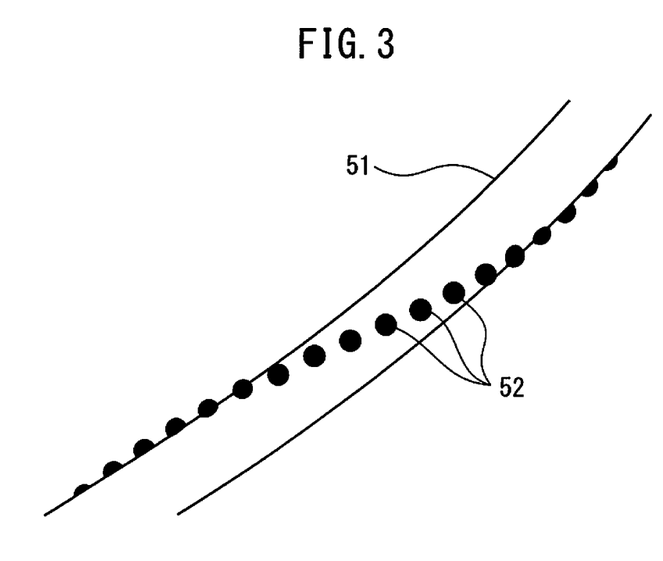
FIG. 3 is a view illustrating an example of wire-shaped member images and focus point images which are displayed by the robot simulation device according to the embodiment of the present invention.

FIG. 3 is a view illustrating examples of wire-shaped member images 51 and focus point images 52. In FIG. 3, the wire-shaped member images 51 are represented by solid lines, and the focus point images 52 are represented by black circles. The focus points 33 are set in line in the longitudinal direction of the wire-shaped member with the same phase in the circumferential direction of the wire-shaped member. Hence, when the wire-shaped member is torsioned, the focus point images 52 are represented in a torsioned state on the wire-shaped member images 51. In this manner, the user can easily grasp the torsioned state of the wire-shaped member.

Figure 4:
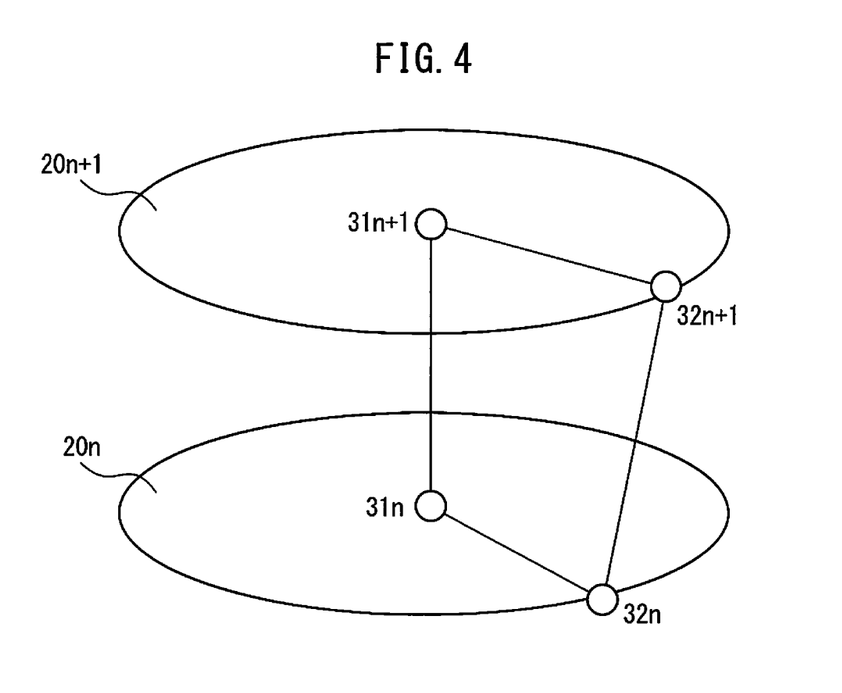
FIG. 4 is a view for explaining a procedure for calculating a torsion amount by the robot simulation device according to the embodiment of the present invention.

The robot simulation device according to the present embodiment is further equipped with the function of calculating a torsion amount of the wire-shaped member in order to quantitatively display the torsioned state of the wire-shaped member. The torsion amount is calculated by the simulation unit 13, for example. FIG. 4 is a view for explaining the procedure of calculating the torsion amount. In FIG. 4, the planes $20n$ and $20n+1$ are planes of the wire-shaped member model which are adjacent to each other and in which the mass points 3 are set, the mass points $31n$ and $31n+1$ are mass points which are located at the centers of the planes $20n$ and $20n+1$, respectively, and the mass points $32n$ and $32n+1$ are mass points which are located in the same position (same phase) with each other in the circumferential direction on the circumferences of the planes $20n$ and $20n+1$, respectively. The mass points $32n$ and $32n+1$ are the focus points 33, for example.

The torsion amount of the wire-shaped member between the planes $20a$ and $20n+1$ can be defined by the angle between a plane defined by the mass points $31n$, $32n$, and $31n+1$ and a plane defined by the mass points $31n+1$, $32n+1$, and $31n$. Then, as directed toward the distal end (hand side) in the longitudinal direction of the wire-shaped member, it is defined such that the right-handed torsion is plus and the left-handed torsion is minus. Under such definition, by integrating the torsion amount from a first wire-shaped member arrangement unit formed in the robot model to a second wire-shaped member arrangement unit adjacent to the first wire-shaped member arrangement unit, it is possible to calculate the total torsion amount of the wire-shaped member between from the first wire-shaped member arrangement unit to the second wire-shaped member arrangement unit.

The simulation unit 13, during the execution of simulation, calculates the torsion amount of the wire-shaped member for each unit time and stores it in a storage unit. In this manner, it is possible to seek a maximum value and a minimum value of the torsion amount. Further, the simulation unit 13 calculates an average value of the maximum value and the minimum value and seeks such a wire-shaped member arrangement orientation (target arrangement orientation) as to decrease the average value. The display unit 14 displays the target arrangement orientation on the display unit.

When the maximum value of the torsion amount is $+50°$ and the minimum value is $-10°$, for example, the average value is $+20°$. Then, a value of torsion amount such as to cancel the average value, i.e., $-20°$ is displayed. The torsion amount as displayed represents the target arrangement orientation (degree) of the wire-shaped member. The user rotates the wire-shaped member at one wire-shaped member arrangement unit through this angle ($-20°$) from the initial state (the state in which the simulation is executed) and then arranges the wire-shaped member. In other words, the user imparts a predetermined amount of initial torsion to the wire-shaped member and then arranges the wire-shaped member. In this manner, it is possible to decrease the maximum torsion amount of the wire-shaped member at the time of actual operation of the robot. When an optical fiber, etc., having a low elasticity are used as the wire-shaped member, it is possible to prevent the wire-shaped member from being broken or damaged.

Figure 5:
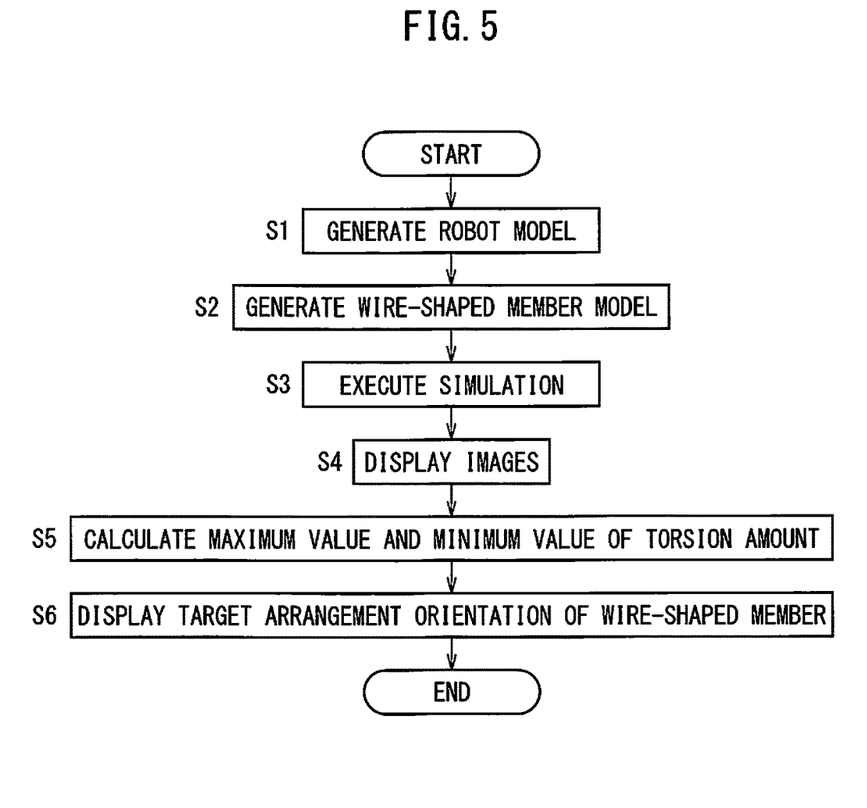
FIG. 5 is a flow chart illustrating an example of process executed by the robot simulation device of FIG. 1.

FIG. 5 is a flow chart illustrating an example of the process performed by the robot simulation device 1. The process illustrated in this flow chart is started when a simulation starting command is inputted via an input unit, for example, after part of the mass points 3 are set as the focus points 33 by the processing at the focus point setting unit 12 as illustrated in FIG. 2.

At step S1, the model generation unit 11 generates a robot model. At step S2, the model generation unit 11 generates a wire-shaped member model 2 as being associated with the robot model. At step S3, the simulation unit 13 causes the robot model to operate in accordance with a predetermined operation program and performs a simulation of the wire-shaped member associated with the operation of the robot.

At step S4, the display unit 14 displays the wire-shaped member images 51 and the focus point images 52 on the display monitor based the result of the simulation. At step S5, the simulation unit 13 calculates a maximum value and a minimum value for the torsion amount of the wire-shaped member. At step S6, the simulation unit 13 calculates an average value for the torsion amount, and calculates a target arrangement orientation of the wire-shaped member, i.e., a rotation amount of the wire-shaped member at the wire-shaped member arrangement unit such as to decrease the average value. The display unit 14 displays the result of the above.

According to the present embodiment, it is possible to achieve the following advantages:

(1) The robot simulation device 1 includes the model generation unit 11 which generates the three-dimensional wire-shaped member model 2 from the plurality of mass points 3 set along the longitudinal direction of the wire-shaped member so as to define the outer circumferential surface of the wire-shaped member and the plurality of spring elements 4 connecting the plurality of mass points 3 together. The robot simulation device 1 includes the focus point setting unit 12 which sets, on the wire-shaped member model 2, the plurality of focus points 33 to grasp the torsioned state of the wire-shaped member. The robot simulation device 1 includes the simulation unit 13 which simulates the behavior of the wire-shaped member associated with the operation of the robot using the wire-shaped member model 2. The robot simulation device 1 includes the display unit 14 which displays the focus point images 52, together with the wire-shaped member images 51, using the time-series position data of the plurality of mass points 3 and the time-series position data of the plurality of focus points 33 which are obtained via the simulation. Thus, by displaying the focus point images 52, together with the wire-shaped member images 51, via the display unit 14, it is possible for the user to easily grasp the torsioned state in the longitudinal direction of the wire-shaped member.

(2) Further, the simulation unit 13 calculates the maximum torsion amount of the wire-shaped member based on the time-series position data of the plurality of focus points 33, and calculates a wire-shaped member arrangement orientation (target arrangement orientation) such as to decrease the maximum torsion amount. The user may arrange the wire-shaped member in conformity to the target arrangement orientation. For example, it is possible to decrease the maximum torsion amount of the wire-shaped member at the time of actual operation of the robot by the user arranging the wire-shaped member with the wire-shaped member being rotated through a predetermined angle at wire-shaped member arrangement unit so as to impart initial torsion to the wire-shaped member.

(3) The setting of the focus points 33 is easy since the plurality of mass points 3 (second mass points 32), which are set on parts in the circumferential direction of the wire-shaped member model 2 in line along the longitudinal direction of the wire-shaped member model 2, are set as the focus points 33. Further, since part of the mass points 3 are made to be the focus points 33, it is not necessary to calculate the position date of the focus points 33 independently of the position data of the mass points 3, thus, it is easy to calculate the position data of the focus points 33.

In the above-described embodiment, part of the mass points 3 are set as the focus points 33, points other than the mass points 3 may be set as the focus points. In the above-described embodiment, the mass points located at the same phase in the circumferential direction of the wire-shaped member in line along the longitudinal direction of the wire-shaped member are made to be the focus points 33, the focus points 33 are not limited thereto. In other words, whatever the control of the focus point setting unit 12 may be, when points which are located in a predetermined positional relationship with each other so as to make it possible to grasp the torsioned state of the wire-shaped member are made to be the focus points 33.

In the above-described embodiment (FIG. 2), the model generation unit 11 generates the wire-shaped member model 2 from the first mass points 31 and second mass points 32, the first springs 41, the second springs 42, the third springs 43, and the fourth springs 44. However, whatever the wire-shaped member model 2 may be, when it is generated from a plurality of mass points and a plurality of spring elements connecting the mass points together, and the control of the model generation unit 11 is not limited to what is described above.

In the above-described embodiment, it is configured so that the display unit 14 displays the wire-shaped member images and the focus point images using the position data of the plurality of mass points and the position data of the plurality of focus points 33 for each predetermined unit time which are obtained via the simulation performed by the simulation unit 13. However, the display unit 14 may be configured to display a still image at a predetermined point of time, and the control of the display unit 14 is not limited to what is described above. In the above-described embodiment (FIG. 3), the focus point images 52 are represented by black circles, whatever the configuration of the focus point image 52 may be, when it is a mark representing the focus point 33. For example, it may be configured so that the focus point image 52 is represented in a display color different from that of other image so as to be identifiably represented.

In the above-described embodiment, the simulation unit 13 seeks the target arrangement orientation of the wire-shaped member as an angle (initial torsion amount) at the wire-shaped member arrangement unit, it may be configured so that as the target arrangement orientation, other information is provided via the display unit 14, and the configuration of the simulation unit 13 is not limited to what is described above.

In the above-described embodiment, the robot simulation device is applied to an articulated robot, the present invention is not limited to such a form but is applicable to a variety of robots on which the wire-shaped member is arranged.

According to the present invention, it is easy for the user to grasp the torsioned state of each part in the longitudinal direction of the wire-shaped member since the time-series position data of the plurality of focus points set on the three-dimensional model of the wire-shaped member is acquired via simulation and the focus point images are displayed using the position data of the focus points.

The above description is merely by way of example, and the present invention is not restricted by the above-described embodiment and modifications thereto as long as they do not impair the features of the present inventions. The components of the above-described embodiment and modifications thereto include substitutable and obviously substitutable components while maintaining the identity of the invention. In other words, the present invention encompasses any other form conceivable within the scope of the technical idea of the present invention as well. Further, it is also possible to arbitrarily combine the above-described embodiment and one or more of the modifications.

The invention claimed is:

1. A robot simulation device configured to simulate a behavior of a wire-shaped member arranged on a robot, comprising:
   a processing unit comprising
      a model generation unit which generates a three-dimensional model of the wire-shaped member from a plurality of mass points set along a longitudinal direction of the wire-shaped member so as to define an outer circumferential surface of the wire-shaped member and a plurality of spring elements connecting the plurality of mass points together;
      a focus point setting unit which sets, on the three-dimensional model of the wire-shaped member, a plurality of focus points to grasp a torsioned state of the wire-shaped member; and
      a simulation unit which performs a simulation of the behavior of the wire-shaped member associated with operation of the robot using the three-dimensional model of the wire-shaped member and executes the simulation so that a position of at least one mass point is changed over time; and a display unit which displays focus point images representing the focus points, together with wire-shaped member images representing a profile of the wire-shaped member, using time-series position data of the plurality of mass points and time-series position data of the plurality of focus points obtained via the simulation performed by the simulation unit, wherein the plurality of focus points are part of the plurality of mass points and are set on part in a circumferential direction of the wire-shaped member in line along a longitudinal direction of the three-dimensional model of the wire-shaped member, and the simulation unit calculates a maximum torsion amount of the wire-shaped member based on the time-series position data of the plurality of focus points, calculates an arrangement orientation of the wire-shaped member so as to decrease the maximum torsion amount of the wire-shaped member to prevent the wire-shaped member from being broken or damaged, and applies the calculated arrangement orientation of the wire-shaped member to control the robot.

2. A robot simulation device configured to simulate a behavior of a wire-shaped member arranged on a robot, comprising:

a processing unit comprising:

a model generation unit configured to generate a three-dimensional model of the wire-shaped member from a plurality of first mass points and a plurality of second mass points, the plurality of second mass points being set along a longitudinal direction of the wire-shaped member so as to define an outer circumferential surface of the wire-shaped member with one first mass point at the center of a plane circumscribed by the circumferential surface, said plane being perpendicular to the longitudinal direction, a plurality of first spring elements connecting the plurality of second mass points together, and a plurality of second spring elements connecting the first mass point to at least one second mass point;

a focus point setting unit configured to set, on the three-dimensional model of the wire-shaped member, a plurality of focus points to grasp a torsioned state of the wire-shaped member; and a simulation unit configured to perform a simulation of the behavior of the wire-shaped member associated with operation of the robot using the three-dimensional model of the wire-shaped member and executes the simulation so that a position of at least one mass point is changed over time; and a display unit configured to display focus point images representing the focus points, together with wire-shaped member images representing a profile of the wire-shaped member, using time-series position data of the plurality of mass points and time-series position data of the plurality of focus points obtained via the simulation performed by the simulation unit, wherein the plurality of focus points are part of the plurality of mass points and are set on part in a circumferential direction of the wire-shaped member in line along a longitudinal direction of the three-dimensional model of the wire-shaped member, and the plane includes the plurality of second spring elements, and the simulation unit is configured to calculate an average torsion amount of the wire-shaped member based on the time-series position data of the plurality of focus points, calculate an arrangement orientation of the wire-shaped member to reduce the average torsion amount of the wire-shaped member to prevent the wire-shaped member from being broken or damaged, and apply the calculated arrangement orientation of the wire-shaped member to control the robot.

* * * * *